United States Patent
Combs et al.

(10) Patent No.: US 6,734,552 B2
(45) Date of Patent: May 11, 2004

(54) ENHANCED THERMAL DISSIPATION INTEGRATED CIRCUIT PACKAGE

(75) Inventors: Edward G. Combs, Foster, CA (US); Robert P. Sheppard, Red Bluff, CA (US); Tai Wai Pun, Tin Shui Wai (HK); Hau Wan Ng, Tuen Mun (HK); Chun Ho Fan, Sham Tseng (HK); Neil Robert McLellen, Mid Levels (HK)

(73) Assignee: ASAT Limited, Tsuen Wan (HK)

( * ) Notice: Subject to any disclaimer, the term of this patent is extended or adjusted under 35 U.S.C. 154(b) by 0 days.

(21) Appl. No.: 09/902,878

(22) Filed: Jul. 11, 2001

(65) Prior Publication Data

US 2003/0011064 A1 Jan. 16, 2003

(51) Int. Cl.⁷ ............................. H01L 23/10; H05K 7/20
(52) U.S. Cl. .................. 257/707; 257/713; 257/717; 257/720; 257/796; 361/688; 361/704; 361/707; 361/709; 361/710
(58) Field of Search .................. 361/600, 679, 361/688, 689, 702, 704, 707–711; 438/106, 121, 122, 413; 257/722, 678, 706, 707, 712, 713, 717, 720, 787, 796

(56) References Cited

U.S. PATENT DOCUMENTS

| | | | |
|---|---|---|---|
| 3,908,075 A | 9/1975 | Jackson et al. ............. 428/133 |
| 3,942,245 A | 3/1976 | Jackson et al. ............. 29/827 |
| 4,501,960 A | 2/1985 | Jouvet et al. ............. 235/492 |
| 4,674,175 A | 6/1987 | Stampfli ..................... 29/827 |
| 4,701,781 A | 10/1987 | Sankhagowit .............. 257/671 |
| 4,975,765 A | 12/1990 | Ackermann et al. ........ 257/737 |
| 5,023,202 A | 6/1991 | Long et al. ................ 29/827 |
| 5,041,395 A | 8/1991 | Steffen ....................... 29/827 |
| 5,122,860 A | 6/1992 | Kikuchi et al. ............. 257/679 |
| 5,157,475 A | 10/1992 | Yamaguchi ................. 257/784 |
| 5,172,213 A | * 12/1992 | Zimmerman ............... 257/796 |
| 5,175,612 A | 12/1992 | Long et al. |

(List continued on next page.)

FOREIGN PATENT DOCUMENTS

| | | |
|---|---|---|
| FR | 2 609 841 | 1/1987 |
| JP | 3-198368 | 8/1991 |
| WO | US 2001/0000927 A1 | 5/2001 |

OTHER PUBLICATIONS

US 5,905,304, 5/1999, Ewer et al. (withdrawn)
English Translation of JP Laid Open Patent Application No. 3–198368 (3 pages).
English Translation of French Publication No. 2 609 841 (14 pages).
U.S. patent application No. 10/062,650, filed Jan. 31, 2002 2001 by McLellan et al.
U.S. patent application No. 10/062,896, filed Jan. 31, 2002 by Pedron et al.
U.S. patent application No. 10/104,263, filed Mar. 22, 2002 by Combs et al.
U.S. patent application No. 10/178,372, filed Jun. 24, 2002 by Pedron et al.

*Primary Examiner*—Alonzo Chambliss
(74) *Attorney, Agent, or Firm*—Milbank, Tweed, Hadley & McCloy LLP

(57) ABSTRACT

In one aspect, the present invention relates to an integrated circuit package includes a semiconductor die electrically connected to a substrate, a heat sink having a top and a side portion, the heat sink further including an extending finger when viewed from a top of the package, the extending finger including the side portion of the heat sink, a thermally conductive element thermally coupled with an interposed between both the semiconductor die and the heat sink, wherein the thermally conductive element does not directly contact the semiconductor die, and an encapsulant material encapsulating the thermally conductive element and the heat sink such that the top portion and the side portion of the heat sink are exposed to the surroundings of the package.

24 Claims, 11 Drawing Sheets

U.S. PATENT DOCUMENTS

| | | | |
|---|---|---|---|
| 5,285,105 A | 2/1994 | Cain | 257/672 |
| 5,334,857 A | 8/1994 | Mennitt et al. | 257/48 |
| 5,366,933 A | 11/1994 | Golwalkar et al. | 29/827 |
| 5,420,460 A | 5/1995 | Massingill | 257/693 |
| 5,474,957 A | 12/1995 | Urushima | 29/827 |
| 5,482,736 A | 1/1996 | Glenn et al. | 427/96 |
| 5,482,898 A | 1/1996 | Marrs | 29/827 |
| 5,485,037 A | 1/1996 | Marrs | |
| 5,556,807 A | 9/1996 | Bhattacharyya et al. | 298/27 |
| 5,596,231 A | 1/1997 | Combs | |
| 5,596,485 A | 1/1997 | Glenn et al. | 361/703 |
| 5,620,928 A | 4/1997 | Lee et al. | |
| 5,650,593 A | 7/1997 | McMillan et al. | |
| 5,672,548 A | 9/1997 | Culnane et al. | |
| 5,672,909 A | 9/1997 | Glenn et al. | 257/668 |
| 5,679,978 A | 10/1997 | Kawahara et al. | |
| 5,693,572 A | 12/1997 | Bond et al. | |
| 5,708,567 A | 1/1998 | Shim et al. | |
| 5,729,432 A | 3/1998 | Shim et al. | |
| 5,736,785 A | 4/1998 | Chiang et al. | |
| 5,789,813 A | 8/1998 | Kirkland et al. | |
| 5,796,163 A | 8/1998 | Glenn et al. | 257/698 |
| 5,807,768 A | 9/1998 | Shin | |
| 5,854,511 A * | 12/1998 | Shin et al. | 257/713 |
| 5,867,368 A | 2/1999 | Glenn | 361/783 |
| 5,874,321 A | 2/1999 | Templeton, Jr. et al. | |
| 5,886,397 A | 3/1999 | Ewer | 257/667 |
| 5,894,108 A | 4/1999 | Mostafazadeh et al. | 174/52.4 |
| 5,900,676 A | 5/1999 | Kweon et al. | 257/787 |
| 5,939,784 A | 8/1999 | Glenn | 257/710 |
| 5,940,271 A | 8/1999 | Mertol | |
| 5,949,655 A | 9/1999 | Glenn | 361/783 |
| 5,950,074 A | 9/1999 | Glenn et al. | 438/121 |
| 5,962,810 A | 10/1999 | Glenn | 174/52.2 |
| 5,981,314 A | 11/1999 | Glenn et al. | 438/127 |
| 5,982,621 A | 11/1999 | Li | |
| 5,986,336 A | 11/1999 | Tomita | |
| 5,986,340 A | 11/1999 | Mostafazadeh et al. | |
| 6,011,304 A | 1/2000 | Mertol | |
| 6,028,354 A | 2/2000 | Hoffmann | |
| 6,034,429 A | 3/2000 | Glenn et al. | 257/701 |
| 6,049,125 A | 4/2000 | Brooks et al. | |
| 6,069,023 A | 5/2000 | Bernier et al. | |
| 6,081,028 A | 6/2000 | Ettehadieh et al. | |
| 6,081,029 A | 6/2000 | Yamaguchi | 257/718 |
| 6,091,603 A * | 7/2000 | Daves et al. | 361/704 |
| 6,092,281 A | 7/2000 | Glenn | 29/841 |
| 6,097,101 A | 8/2000 | Sato et al. | |
| 6,104,086 A | 8/2000 | Ichikawa et al. | |
| 6,111,324 A | 8/2000 | Sheppard et al. | |
| 6,117,193 A | 9/2000 | Glenn | 29/25.01 |
| 6,117,705 A | 9/2000 | Glenn et al. | 438/106 |
| 6,127,724 A | 10/2000 | DiStefano | |
| 6,143,588 A | 11/2000 | Glenn | 438/116 |
| 6,150,193 A | 11/2000 | Glenn | 438/113 |
| 6,162,849 A | 12/2000 | Zhuo et al. | |
| 6,163,458 A | 12/2000 | Li | |
| 6,165,612 A | 12/2000 | Misra | |
| 6,191,360 B1 | 2/2001 | Tao et al. | |
| 6,196,002 B1 | 3/2001 | Newman et al. | |
| 6,198,163 B1 | 3/2001 | Crowley et al. | 257/706 |
| 6,206,997 B1 | 3/2001 | Egitto et al. | |
| 6,208,519 B1 | 3/2001 | Jiang et al. | |
| 6,212,070 B1 | 4/2001 | Atwood et al. | |
| 6,214,644 B1 | 4/2001 | Glenn | 438/108 |
| 6,219,238 B1 | 4/2001 | Andros et al. | |
| 6,222,263 B1 | 4/2001 | Sherif et al. | |
| 6,228,676 B1 | 5/2001 | Glenn et al. | 438/107 |
| 6,229,200 B1 | 5/2001 | Mclellan et al. | |
| 6,229,702 B1 | 5/2001 | Tao et al. | |
| 6,236,568 B1 * | 5/2001 | Lai et al. | 361/704 |
| 6,242,281 B1 | 6/2001 | McLellan et al. | 438/106 |
| 6,246,566 B1 | 6/2001 | Glenn | 361/220 |
| 6,258,629 B1 | 7/2001 | Niones et al. | 438/111 |
| 6,265,771 B1 * | 7/2001 | Ference et al. | 257/706 |
| 6,266,197 B1 | 7/2001 | Glenn et al. | 359/819 |
| 6,274,927 B1 | 8/2001 | Glenn | 257/680 |
| 6,281,241 B1 | 8/2001 | Elsner | 514/515 |
| 6,281,568 B1 | 8/2001 | Glenn et al. | 257/684 |
| 6,285,075 B1 | 9/2001 | Combs et al. | 257/675 |
| 6,291,884 B1 | 9/2001 | Glenn et al. | 257/747 |
| 6,294,100 B1 | 9/2001 | Fan et al. | 216/14 |
| 6,294,830 B1 | 9/2001 | Fjelstad | 257/724 |
| 6,326,678 B1 | 12/2001 | Karnezos et al. | 257/666 |
| 6,395,578 B1 | 5/2002 | Shin et al. | 438/106 |
| 6,396,143 B1 | 5/2002 | Kimbara et al. | |
| 6,429,048 B1 | 8/2002 | McLellan et al. | 438/108 |
| 6,429,508 B1 | 8/2002 | Gang | 257/678 |
| 6,433,360 B1 | 8/2002 | R. Dosdos et al. | |
| 6,444,498 B1 * | 9/2002 | Huang et al. | 438/126 |
| 6,452,255 B1 | 9/2002 | Bayan et al. | 257/666 |
| 6,458,626 B1 * | 10/2002 | Huang et al. | 438/112 |
| 6,498,099 B1 | 12/2002 | McLellan et al. | 438/689 |
| 6,507,102 B2 | 1/2003 | Juskey et al. | 257/706 |
| 6,552,417 B2 | 4/2003 | Combs | 257/666 |
| 6,556,740 B1 | 4/2003 | Hagelin et al. | 385/15 |
| 2002/0079570 A1 | 6/2002 | Ho et al. | 257/697 |

* cited by examiner

ENHANCED THERMAL DISSIPATION INTEGRATED CIRCUIT PACKAGE

FIELD OF THE INVENTION

The present invention relates to integrated circuit packaging and manufacturing thereof, and more particularly, to integrated circuit packaging for enhanced dissipation of thermal energy.

BACKGROUND OF THE INVENTION

A semiconductor device generates a great deal of heat during normal operation. As the speed of semiconductors has increased, so too has the amount of heat generated by them. It is desirable to dissipate this heat from an integrated circuit package in an efficient manner.

A heat sink is one type of device used to help dissipate heat from some integrated circuit packages. Various shapes and sizes of heat sink devices have been incorporated onto, into or around integrated circuit packages for improving heat dissipation from the particular integrated circuit package. For example, U.S. Pat. No. 5,596,231 to Combs, entitled "High Power Dissipation Plastic Encapsulated Package For Integrated Circuit Die," discloses a selectively coated heat sink attached directly on to the integrated circuit die and to a lead frame for external electrical connections.

SUMMARY OF THE INVENTION

In one aspect, the invention features an integrated circuit package with a semiconductor die electrically connected to a substrate, a heat sink having a portion thereof exposed to the surroundings of the package, a thermally conductive element thermally coupled with and interposed between both the semiconductor die and the heat sink, wherein the thermally conductive element does not directly contact the semiconductor die, and an encapsulant material encapsulating the thermally conductive element and the heat sink such that a portion of the heat sink is exposed to the surroundings of the package.

In another aspect, the invention features an integrated circuit package with a semiconductor die electrically connected to a substrate, a heat sink having a portion thereof exposed to the surroundings of the package, means for thermally coupling the semiconductor die with the heat sink to dissipate heat from the semiconductor die to the surroundings of the package, wherein the means for thermally coupling is interposed between the semiconductor die and the heat sink but does not directly contact the semiconductor die, and means for encapsulating the thermally conductive element and the heat sink such that a portion of the heat sink is exposed to the surroundings of the package.

In yet another aspect, the invention features an integrated circuit package with a substrate having an upper face with an electrically conductive trace formed thereon and a lower face with a plurality of solder balls electrically connected thereto, wherein the trace and at least one of the plurality of solder balls are electrically connected, a semiconductor die mounted on the upper face of the substrate, wherein the semiconductor die is electrically connected to the trace, a heat sink having a top portion and a plurality of side portions, a thermally conductive element thermally coupled to but not in direct contact with the semiconductor die, wherein the thermally conductive element is substantially shaped as a right rectangular solid, is interposed between said semiconductor die and said heat sink, and is attached to said heat sink, and an encapsulant material formed to encapsulate the upper face of the substrate, the semiconductor die, the thermally conductive element and substantially all of the heat sink except the top portion and the side portions of the heat sink.

In a further aspect, the invention features an integrated circuit package with a substrate having means for electrically interconnecting a semiconductor die and means for exchanging electrical signals with an outside device, a semiconductor die attached and electrically connected to the substrate by attachment means, a heat sink having means for dissipating thermal energy to the surroundings of the package, means for thermally coupling the semiconductor die to the heat sink to dissipate heat from said semiconductor die to the surroundings of said package, wherein said means for thermally coupling is interposed between said semiconductor die and said heat sink but does not directly contact the semiconductor die, and means for encapsulating said semiconductor die, said thermally conductive element and said heat sink such that said portion of said heat sink is exposed to the surroundings of said package but is substantially encapsulated.

In another aspect, the invention features a method of manufacturing an integrated circuit package including installing a carrier onto an upper surface of a substrate, wherein the carrier defines a cavity, attaching a semiconductor die to the upper surface of the substrate within the cavity of the carrier, aligning an assembly over the semiconductor die, wherein the assembly comprises a heat sink and a thermally conductive element, resting the assembly on the carrier such that the thermally conductive element does not directly contact the semiconductor die, and encapsulating the cavity to form a prepackage such that a portion of the heat sink is exposed to the surroundings of the package.

In yet another aspect, the invention features a method of manufacturing an integrated circuit package including installing a carrier onto a substrate, attaching a semiconductor die to the substrate, aligning an assembly over the semiconductor die, wherein the assembly has a heat sink and a thermally conductive element, resting the assembly on the carrier such that the thermally conductive element does not directly contact the semiconductor die, and encapsulating the thermally conductive element and the heat sink such that a portion of the heat sink is exposed to the surroundings of the package.

BRIEF DESCRIPTION OF THE DRAWINGS

The foregoing features and other aspects of the invention are explained in the following description taken in connection with the accompanying drawings, wherein.

DETAILED DESCRIPTION OF PREFERRED EMBODIMENTS

Various embodiments of the integrated circuit package of the present invention will now be described with reference to the drawings.

Figure 1:
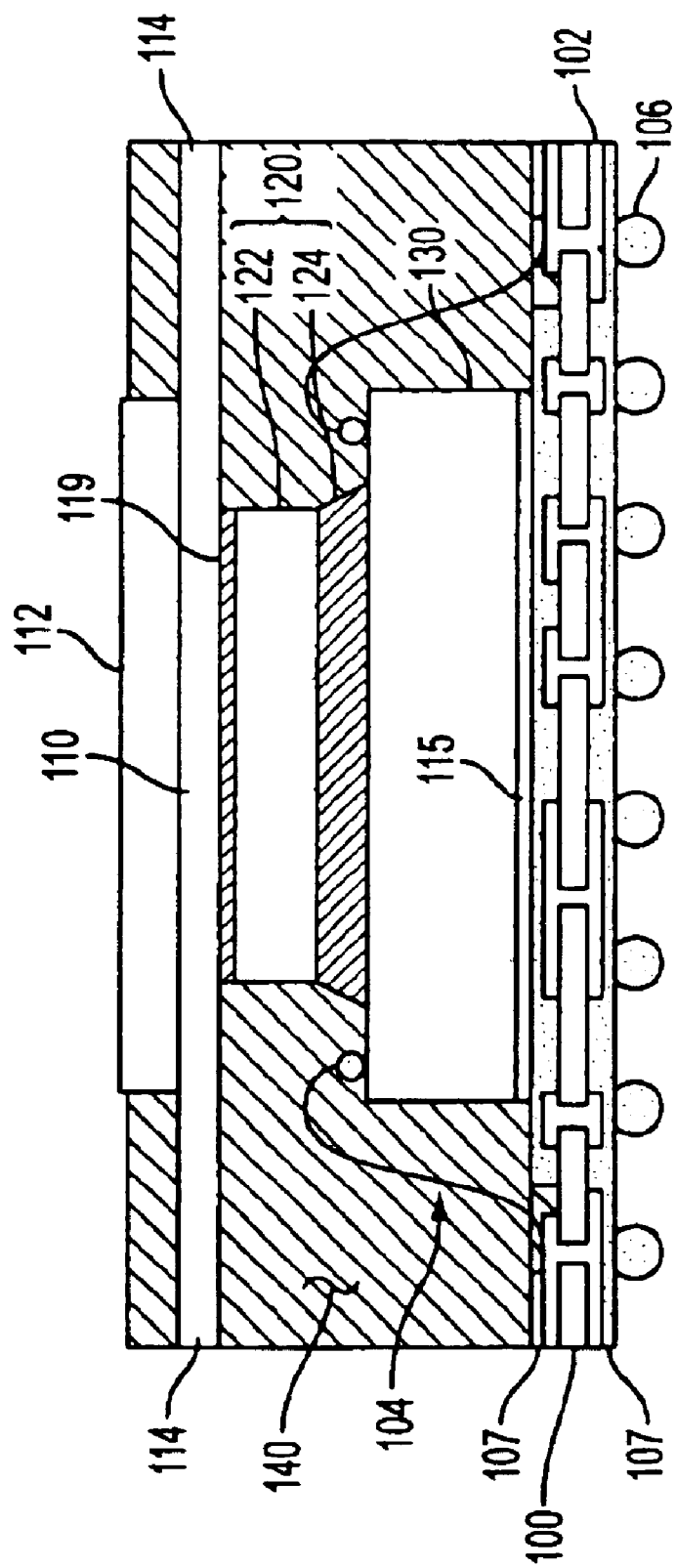
FIG. 1 is a simplified cross-sectional view of an integrated circuit package according to one embodiment of the present invention.
Figure 11:
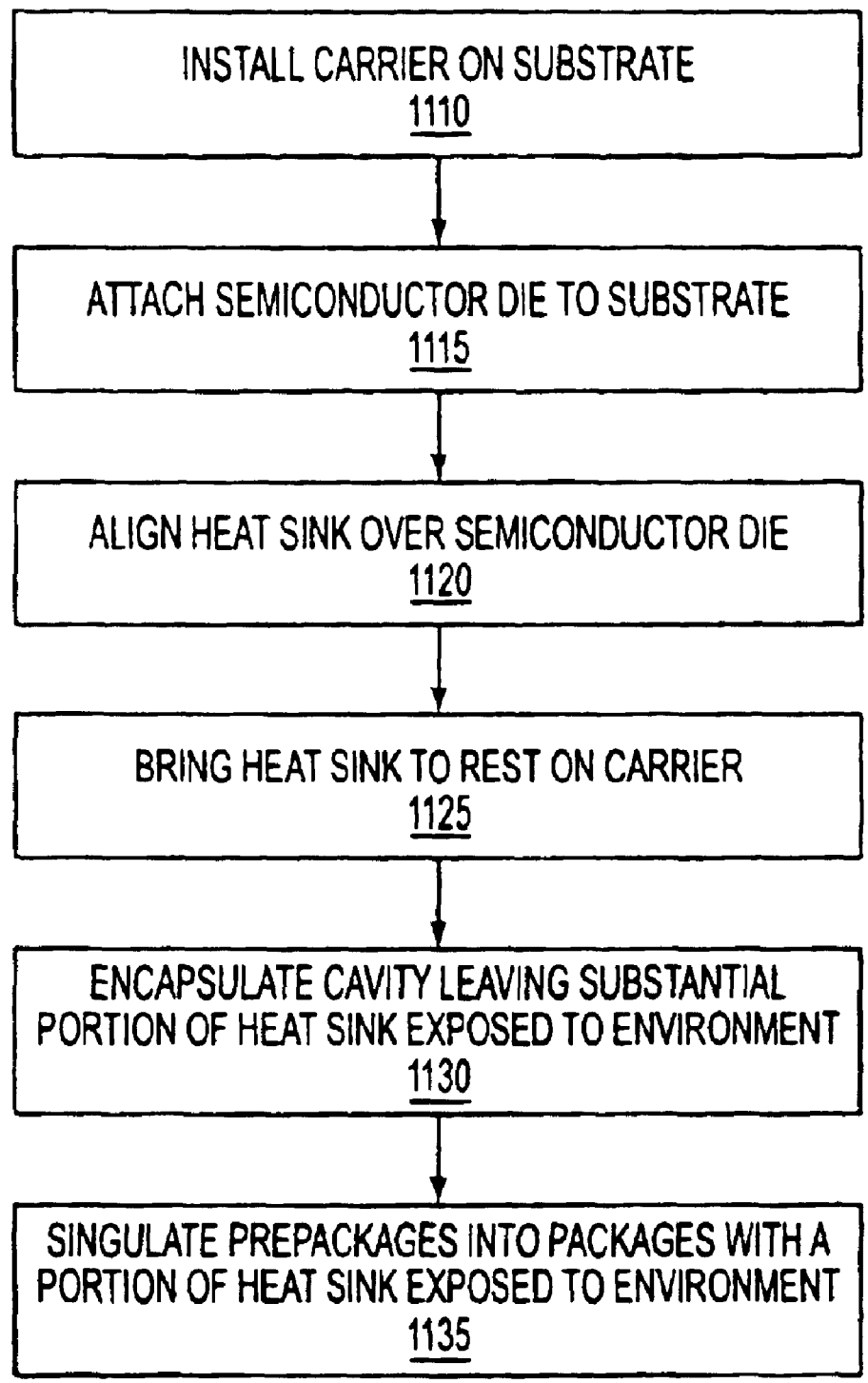
FIG. 11 shows a flowchart of major steps performed in assembly of one embodiment of an integrated circuit package.

FIG. 1 shows certain components of an integrated circuit package according to one embodiment of the present invention displayed in their respective positions relative to one another. The integrated circuit package depicted in FIG. 1 generally includes a substrate 100, a heat sink 110, an adapter assembly 120, a semiconductor die 130 and an encapsulant 140. Each of the foregoing will now be described in greater detail along with the manufacturing steps (shown in FIG. 11) associated with them.

A substrate 100 of either a rigid material (e.g., BT, FR4, or ceramic) or a flexible material (e.g., polyimide) has circuit traces 102 onto which a semiconductor die 130 can be interconnected using, for example, wire bonding techniques, direct chip attachment, or tape automated bonding. FIG. 1 shows a semiconductor die 130 connected to the traces 102 of the substrate 100 via a gold thermo-sonic wire bonding technique. In such an embodiment, gold wires 104 interconnect the semiconductor die 130 to the traces of the substrate 100. In another embodiment, shown in FIG. 3, the semiconductor die 130 is connected to the traces 102 via a direct chip attachment technique including solder balls 105. The substrate 100 may be produced in strip form to accommodate standard semiconductor manufacturing equipment and process flows, and may also be configured in a matrix format to accommodate high-density packaging.

In one embodiment, the traces 102 are embedded photolithographically into the substrate 100, and are electrically conductive to provide a circuit connection between the semiconductor die 130 and the substrate 100. Such traces 102 also provide an interconnection between input and output terminals of the semiconductor die 130 and external terminals provided on the package. In particular, the substrate 100 of the embodiment shown in FIG. 1 has a two-layer circuit trace 102 made of copper. A multilayer substrate may also be used in accordance with an embodiment. The substrate 100 shown in FIG. 1 has several vias drilled into it to connect the top and bottom portions of each circuit trace 102. Such vias are plated with copper to electrically connect the top and bottom portions of each trace 102. The substrate 100 shown in FIG. 1 also has a solder mask 107 on the top and bottom surfaces. The solder mask 107 of one embodiment electrically insulates the substrate and reduces wetting (i.e., reduces wanted flow of solder into the substrate 100.)

As shown in FIG. 1, the external terminals of the package of one embodiment of the present invention include an array of solder balls 106. In such an embodiment, the solder balls 106 function as leads capable of providing power, signal inputs and signal outputs to the semiconductor die 130. Those solder balls are attached to corresponding traces 102 using a reflow soldering process. The solder balls 106 can be made of a variety of materials including lead (Pb) free solder. Such a configuration may be referred to as a type of ball grid array. Absent the solder balls 106, such a configuration may be referred to as a type of LAN grid array.

Figure 2:
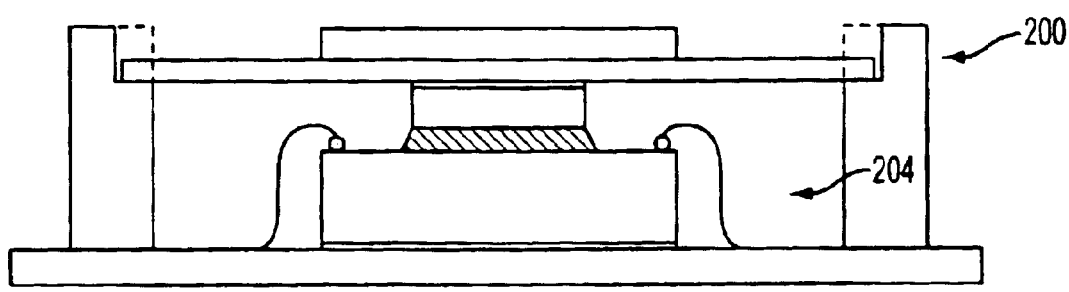
FIG. 2 is a simplified cross-sectional view of a subassembly of the integrated circuit package shown in FIG. 1, prior to encapsulation and singulation assembly steps.
Figure 3:
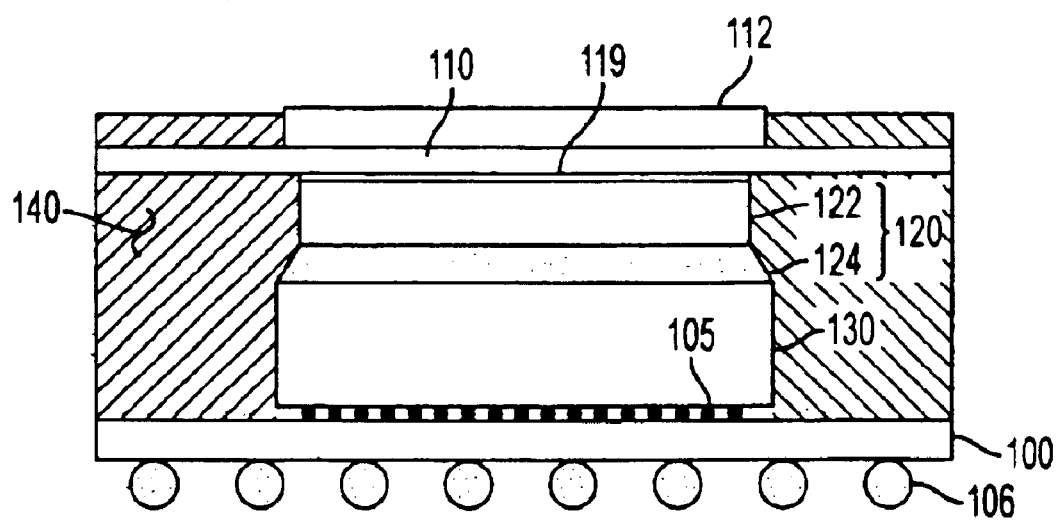
FIG. 3 is a simplified cross-sectional view of an integrated circuit package according to another embodiment of the invention, which has a direct chip attachment.

As shown in FIGS. 1 and 2, the semiconductor die 130 may be mounted or attached to the substrate 100 (step 1115) with an adhesive material 115, such as epoxy. However, as shown in FIG. 3, a solder reflow process or other suitable direct chip attachment technique may also be used as an alternative way to attach the semiconductor die 130 to the substrate 100 (step 1115).

In the embodiment shown in FIG. 1, the heat sink 110 is aligned with and positioned above the top surface of the semiconductor die 130, but not in direct contact with any portion of the semiconductor die 130. The heat sink 110 is preferably made of a thermally conductive material such as copper or copper alloy.

Figure 4A:
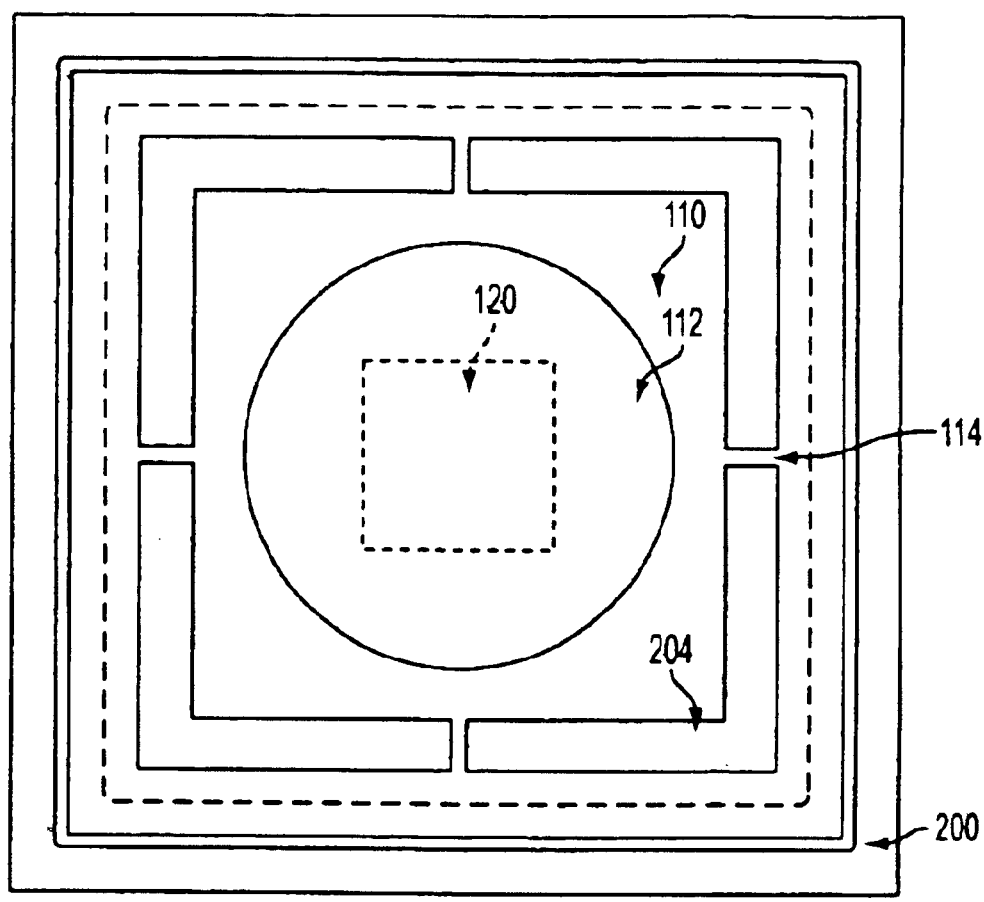
FIG. 4A is a plan view of the subassembly of FIG. 2 having one type of heat sink assembly used in the integrated circuit package shown in FIG. 1.
Figure 4B:
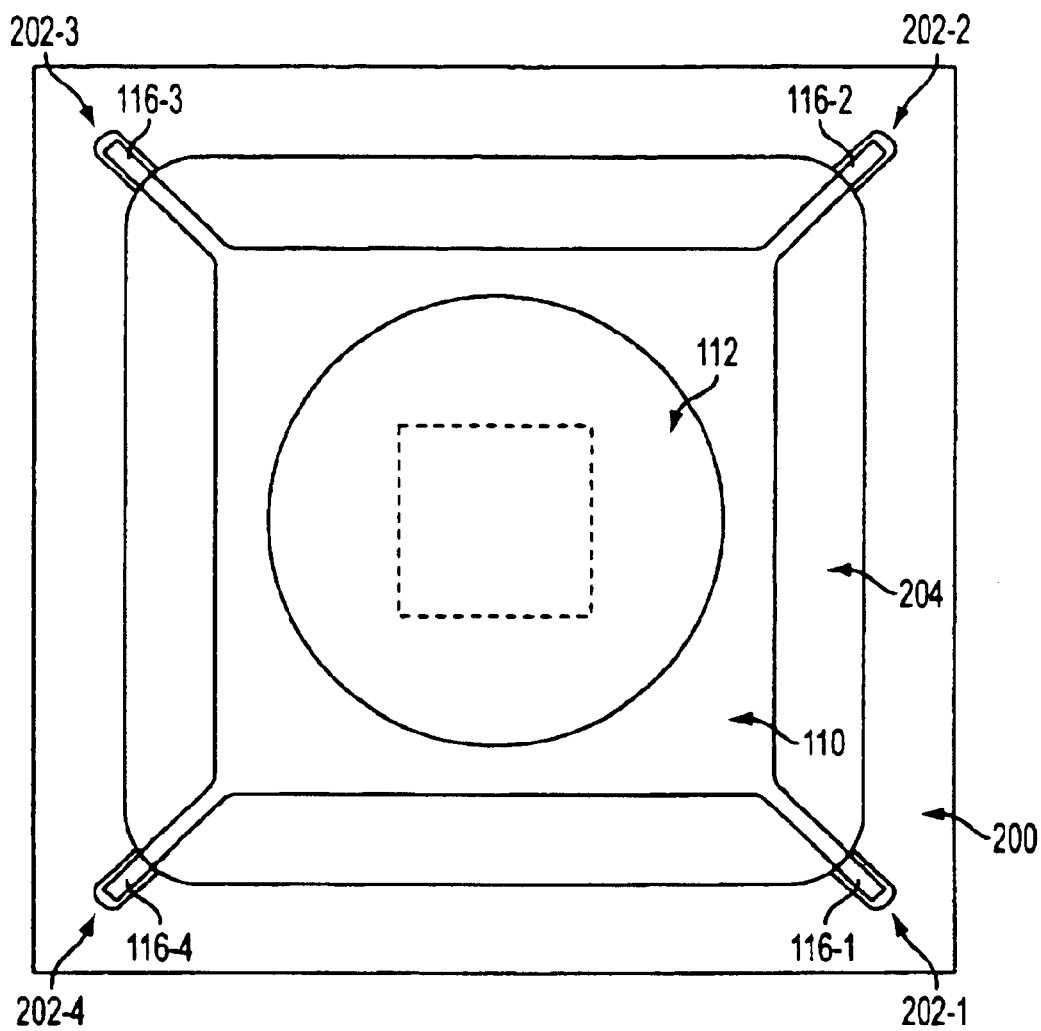
FIG. 4B is a plan view of a subassembly of an integrated circuit package having a second type of heat sink capable of being used in the integrated circuit package shown in FIG. 1.
Figure 5:
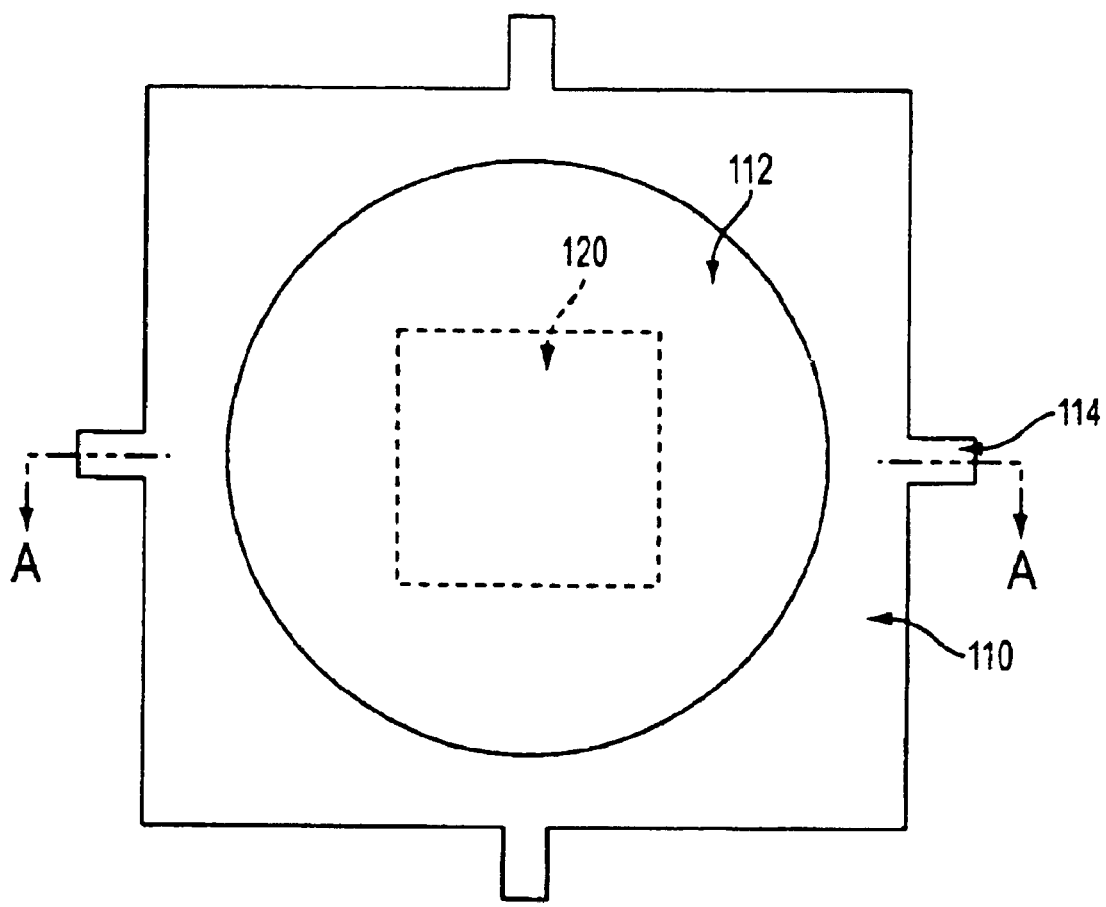
FIG. 5 is a plan view of the heat sink shown in the subassembly of FIG. 4A.
Figure 9A:
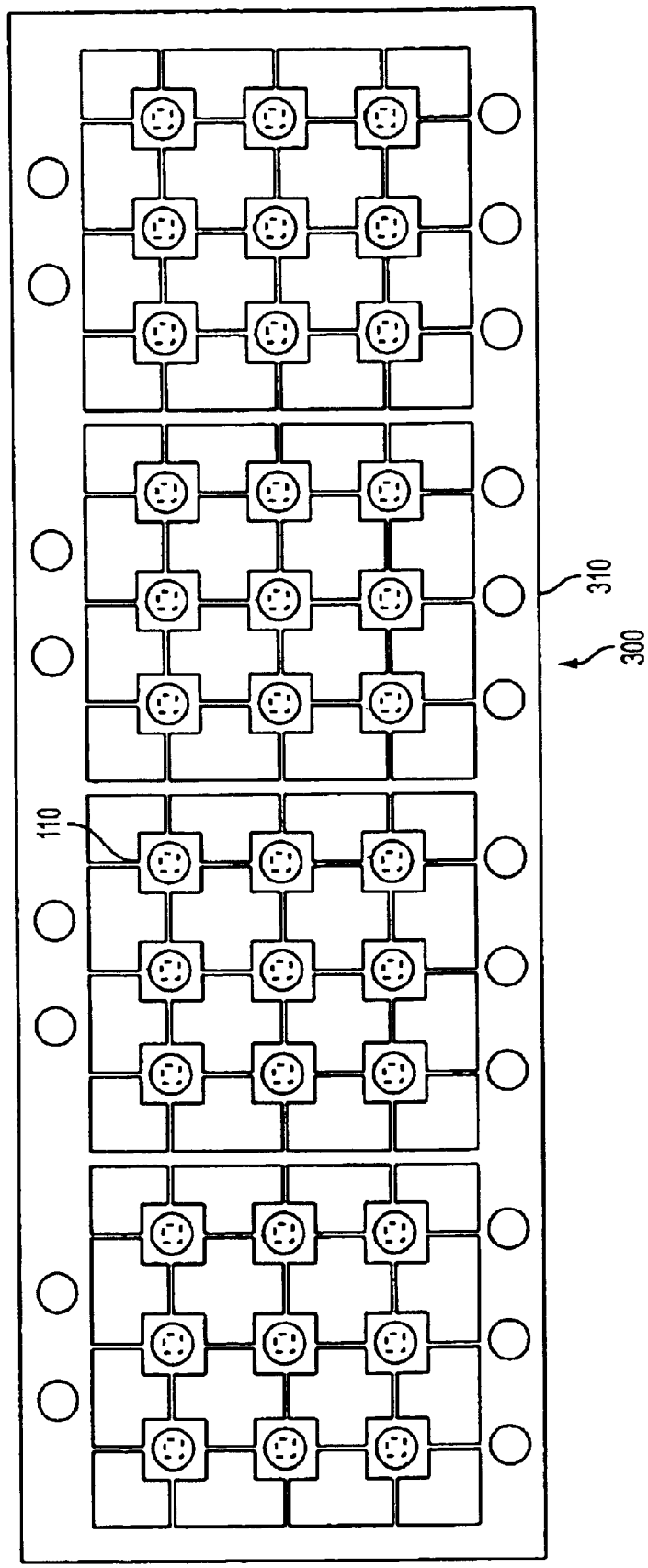
FIG. 9A is a plan view of a matrix frame containing a "3×3" matrix of heat sinks of the type shown in FIG. 5.
Figure 9B:
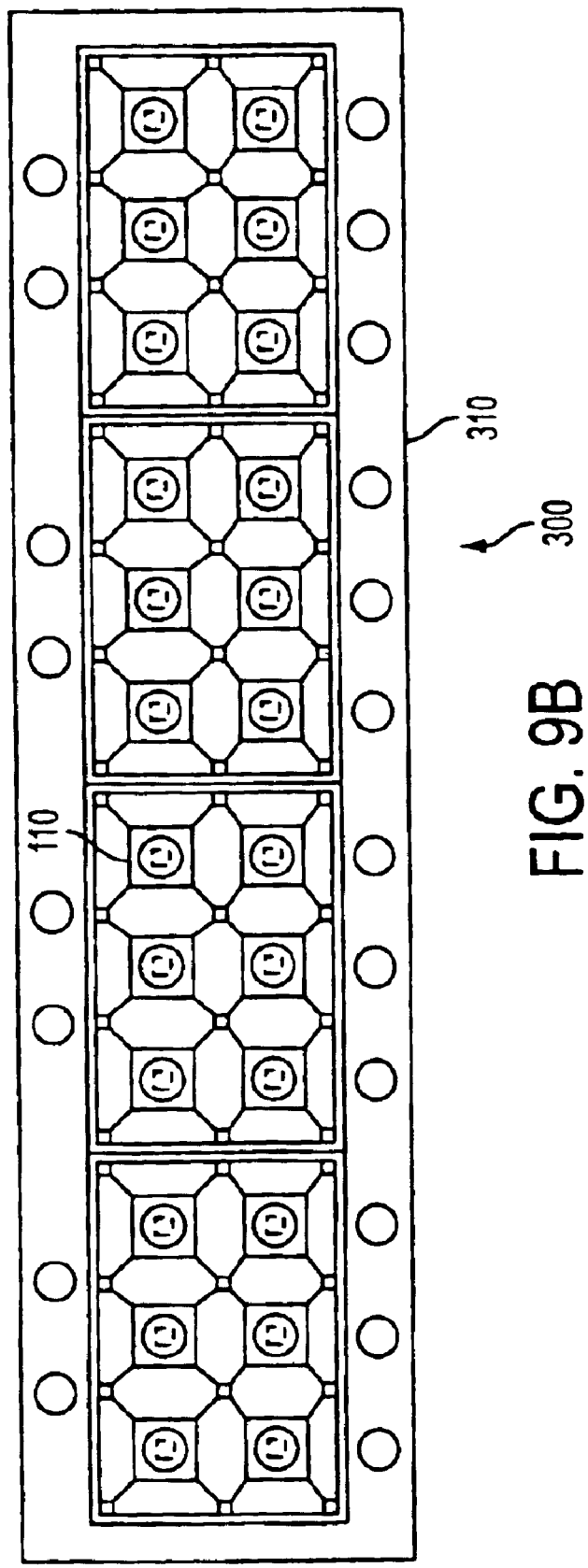
FIG. 9B is a plan view of another matrix frame containing a "2×3" matrix of heat sinks of the type shown in FIG. 4B.

One embodiment of an assembly process for manufacturing an integrated circuit package of the present invention uses a carrier 200 as shown in FIGS. 2, 4A and 4B. FIG. 2 shows, in cross-sectional view, a carrier 200 installed onto the substrate 100. The carrier 200 can be mounted on the substrate 100 by mechanical fastening, adhesive joining or other suitable technique (step 1110). The carrier 200 may have one or more recesses 202 sized to accept support structure 114 of a heat sink assembly (step 1125). In general, the carrier 200 is configured to accept either an individual heat sink assembly (as shown in FIGS. 4A and 4B), or a matrix heat sink assembly 310 containing a number of ad heat sinks 110 (as shown in FIGS. 9A and 9B) in order to align and install heat sinks 110 of either single semiconductor packages, or arrays of packages manufactured in a matrix configuration. The support structure 114 helps to properly align the heat sink 110 during Ian assembly (step 1120) and, accordingly, may be removed (as discussed below) in whole or in part prior to completion of an integrated circuit package. In one preferred embodiment, however, some portions of the support structure 114 remain in the final integrated circuit package and are exposed to the ambient environment. For example, in the embodiment depicted in FIG. 1, portions of the support structure 114 serve as heat dissipation surfaces.

Further details of the heat sink 110 of a subassembly shown in FIG. 4B include extending fingers 116-1, 116-2, 116-3 and 116-4 of the support structure 114. As shown in plan view by FIG. 4B, the fingers 116-1, 116-2, 116-3 and 116-4 may be sized and shaped to engage matching wells or recesses 202-1, 202-2, 202-3 and 202-4 in the supporting walls of the carrier 200 (step 1125). Such fingers 116-1, 116-2, 116-3 and 116-4 in whole or in part support the heat sink 110 prior to encapsulation (step 1130) and align the heat sink 110 above the semiconductor die 130.

Figure 6:
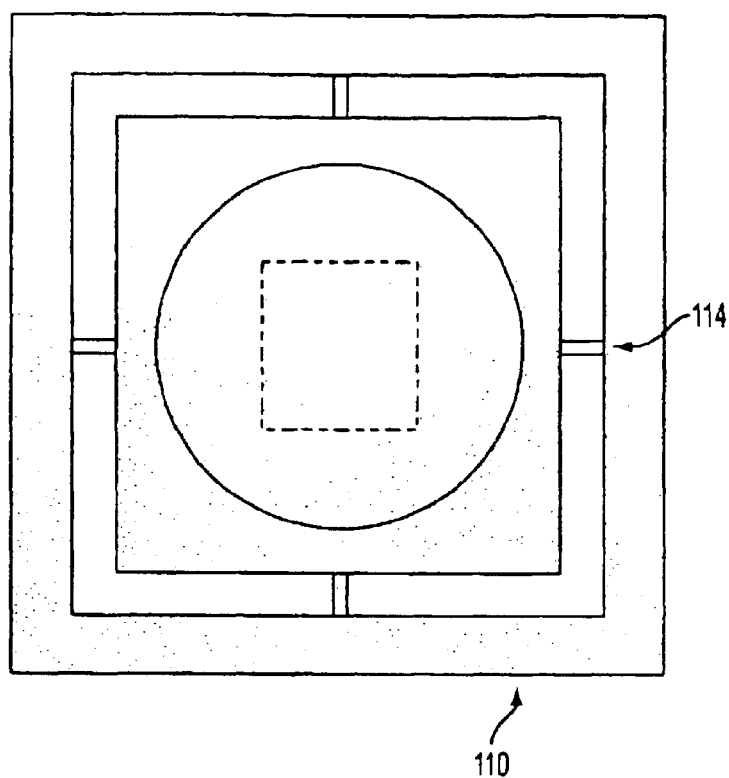
FIG. 6 is a plan view of a heat sink assembly as shown in FIG. 4A, which becomes the heat sink shown in FIG. 5 once assembled into an integrated circuit package such as the embodiment shown in FIG. 1.
Figure 7:
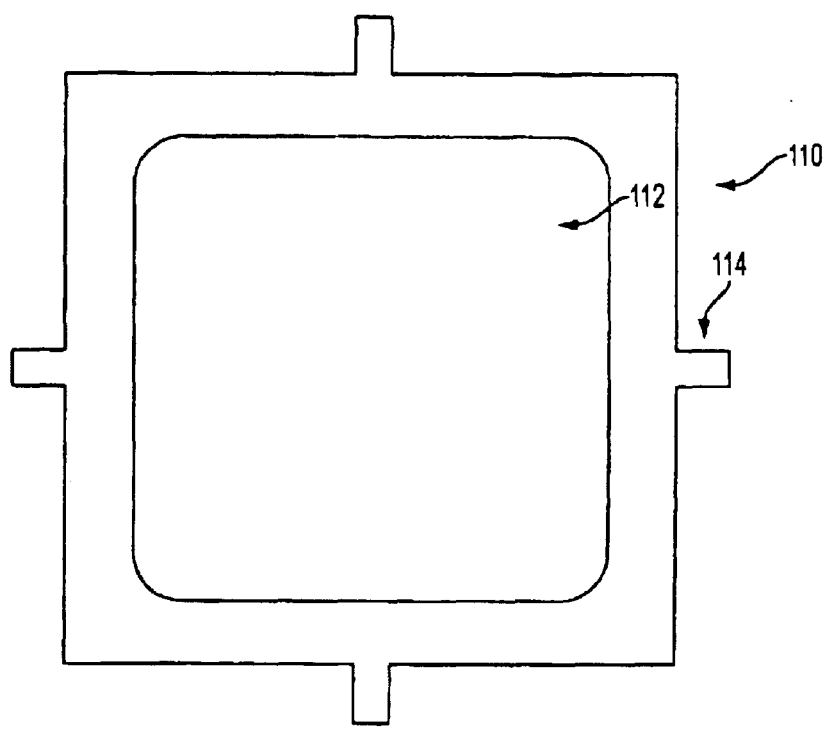
FIG. 7 is a plan view of a third type of heat sink capable of being used in the integrated circuit package shown in FIG. 1.
Figure 8:
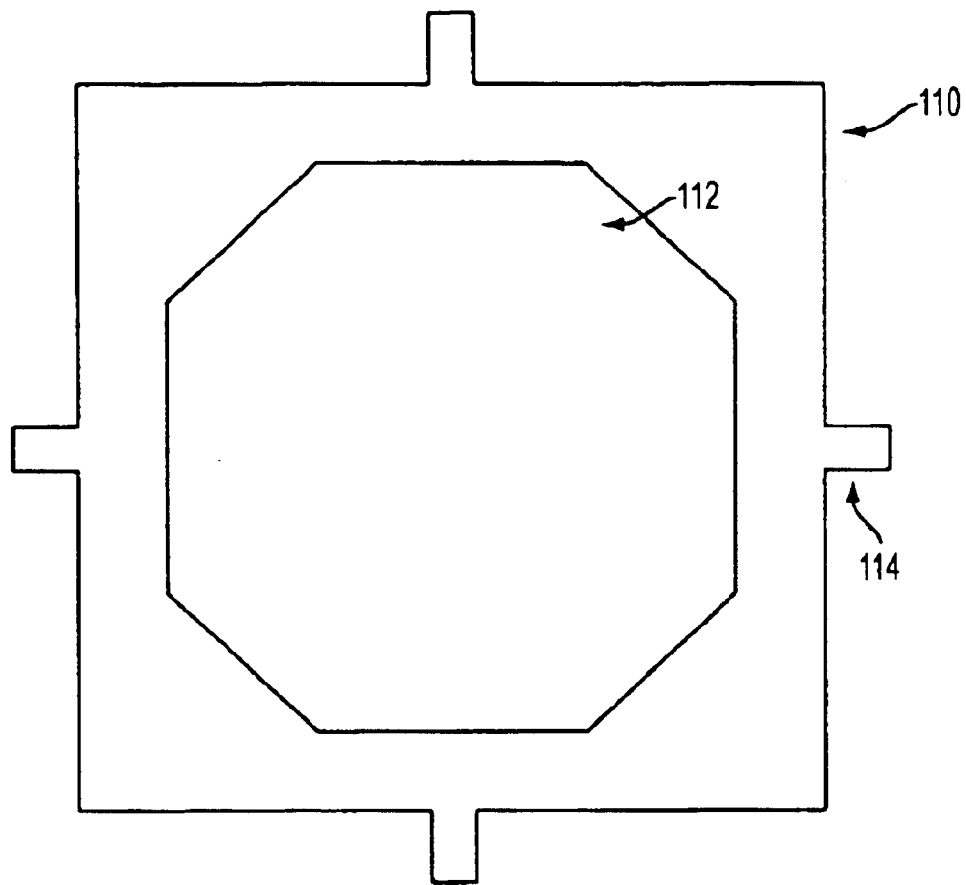
FIG. 8 is a plan view of a fourth type of heat sink capable of being used in the integrated circuit package shown in FIG. 1.

A number of types of heat sinks 110 may be used. FIGS. 4B, 5, 7 and 8 each show a different geometry for a heat sink 110. The heat sink 110 may be sized and configured for use in a specific package arrangement. For example, the heat sink 110 may be sized for incorporation into a package having only a single semiconductor die 130 (see FIG. 1). Alternatively, several heat sinks 110 may be arranged in a matrix configuration 300 to accommodate the assembly of several packages at once. Such a matrix configuration 300 is selected to allow each heat sink 110 of the matrix to be aligned with the corresponding semiconductor die 130 and an underlying matrix package substrate 100. Although a 2×3 and a 3×3 matrix of heat sinks 110 within each matrix heat sink assembly 310 are shown in FIGS. 9A and 9B, a number of matrix combinations and configurations are acceptable. FIG. 9A shows a 3×3 matrix of heat sinks 110, wherein each heat sink 110 has a geometry similar to that of an embodiment shown in FIGS. 4A, 5 and 6. FIG. 9B shows a 2×3 matrix of heat sinks 110, wherein each heat sink 110 has a geometry similar to that of an embodiment shown in FIG. 4B.

Figure 10:
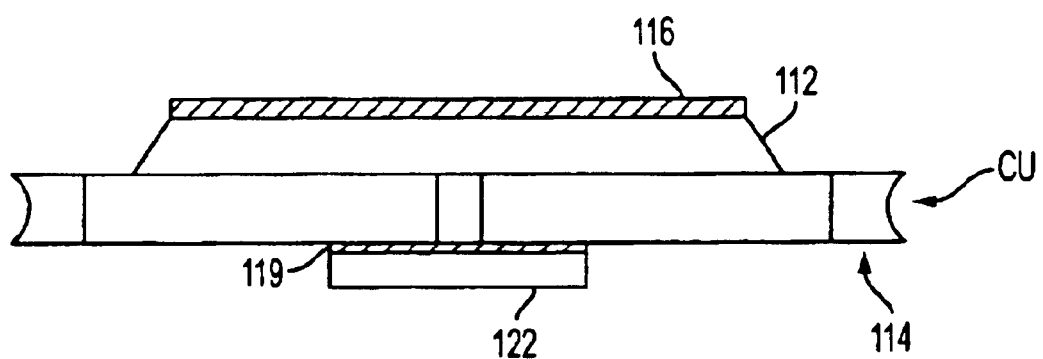
FIG. 10 is a simplified cross-sectional view along line A—A of the heat sink shown in FIG. 5, and a thermally conductive element of one embodiment.

In one embodiment, the heat sink 110 has a raised portion 112 protruding above a primary plane of the heat sink 110. As shown in FIG. 10, an exposed surface of the raised portion 112 may be plated with nickel 116, and functions as a heat dissipation interface with the ambient environment. The nickel plating 116 protects the heat sink 110 during environmental testing by resisting oxidation of certain heat sink materials, such as copper. The raised portion 112 can be formed by removing the surrounding portion of the upper surface of the heat sink 110, for example, by etching. In a preferred embodiment, the heat sink 110 is also oxide coated to enhance the adhesion between the encapsulant material 140 and the heat sink 110. The oxide coating may be achieved or applied by chemical reaction.

The adaptor assembly 120 shown in FIGS. 1 and 2 provides a thermal path between the semiconductor die 130 and the heat sink 110. Such an adaptor assembly 120 includes an adaptor element 122 made of a thermally conductive material (e.g., alumina ($Al_2O_3$), aluminum nitride, beryllium oxide (BeO), ceramic material, copper, diamond compound, or metal) appropriate for heat transfer between the semiconductor die 130 and the heat sink 110. In one embodiment, the adaptor element 122 is shaped as a right rectangular solid, such that its upper and lower faces have dimensions similar to the upper face of the semiconductor die 130.

One dimension of the adaptor element 122 may be selected to match the area of the upper surface of the semiconductor die 130. The thickness of the adaptor element 122 may also be selected to accommodate size variations of the semiconductor die 130 and the heat sink 110. By reducing the distance between the semiconductor die 130 and the externally exposed heat sink 110, the adaptor assembly 120 reduces the thermal resistance of the die-to-sink interface.

In a preferred embodiment, the distance from the upper surface of the semiconductor die 130 to the adaptor element 122 is minimized to reduce the thermal resistance between the semiconductor die 130 and the heat sink 110. However, to avoid imparting stress to the semiconductor die 130, the adaptor element 122 does not directly contact the semiconductor 130 surface. In a preferred embodiment, the distance between the adaptor element 122 and the semiconductor 130 surface is about five (5) mils or less.

An adhesive layer 119, having both high thermal conductivity and deformability to minimize stress, such as an elastomer, may be used to join the adaptor element 122 to the heat sink 110. In a preferred embodiment, such an adhesive layer 119 is electrically and thermally conductive.

The adaptor assembly 120 may also include a polymeric thermal interface 124 between the semiconductor die 130 and the adaptor element 122 to further minimize the thermal resistance of the die-to-sink interface. In a preferred embodiment, the coefficient of polymeric thermal expansion (CTE) of the thermal interface 124 is similar to that of silicon to minimize stress on the semiconductor die 130. In one embodiment, a thermal interface 124 portion of the adaptor assembly 120 may be attached to the heat sink 110 to reduce the distance from the surface of the semiconductor die 130 to the heat sink 110.

As shown in FIG. 1, the semiconductor die 130, adaptor assembly 120 and a portion of the heat sink 110 are encapsulated to form an integrated circuit package according to one embodiment of the present invention. The encapsulant 140 may be an epoxy based material applied by, for example, either a liquid molding encapsulation process or a transfer molding technique. In one assembly method embodiment of the invention, the encapsulation step 1130 occurs after the carrier 200 is attached to the substrate 100 (step 1110), and the heat sink 110 is installed in the carrier 200 (step 1125). During such an encapsulation step 1130, the cavity 204 of the carrier 200 is filled with encapsulant 140. Solder balls 106 are then attached to the traces 102 of the substrate 100 using a reflow soldering process. After such encapsulation and ball attachment assembly steps, the integrated circuit packages are removed from the strip and singulated into individual units using a saw singulation or punching technique (step 1135). Upon completion of these assembly steps, the top portion 112 and some portions of the support structure 114 of the heat sink 110 remain exposed to allow heat transfer and dissipation to the ambient environment of the integrated circuit package (see FIG. 1).

Although specific embodiments of the present invention have been shown and described, it is to be understood that there are other embodiments which are equivalent to the described embodiments. Accordingly the invention is not to be limited by the specific illustrated embodiments, but only by the scope of the appended claims.

What is claimed is:

1. An integrated circuit package, comprising:
   a semiconductor die electrically connected to a substrate;
   a heat sink comprising a top portion and a side portion, said heat sink further comprising an extending finger when viewed from a top of said package, said extending finger said side portion;
   a thermally conductive element thermally coupled with and interposed between both said semiconductor die and said heat sink, wherein said thermally conductive element does not directly contact said semiconductor die; and
   an encapsulant material encapsulating said thermally conductive element and said heat sink such that said top portion and said side portion of said beat sink are exposed to the surroundings of said package.

2. The integrated circuit package of claim 1, wherein said thermally conductive element is substantially shaped as a right rectangular solid.

3. The integrated circuit package of claim 1, wherein said thermally conductive element is made of a material from the group consisting of alumina, aluminum nitride, beryllium oxide, ceramic material, copper, diamond compound, and metal.

4. The integrated circuit package of claim 1, wherein said integrated circuit package is a ball grid array integrated circuit package.

5. The integrated circuit package of claim 1, further comprising an interface element interposed between said thermally conductive element and said semiconductor die.

6. The integrated circuit package of claim 5, wherein said interface element is made of a polymeric material.

7. The integrated circuit package of claim 1, wherein a distance between said semiconductor die and said thermally conductive element is about five (5) mils or Less.

8. The integrated circuit package of claim 1, wherein said semiconductor die is electrically connected to said substrate by direct chip attachment.

9. The integrated circuit package of claim 1, wherein said extending finger extends from a corner of said heat sink.

10. An integrated circuit package, comprising:
   a semiconductor die electrically connected to a substrate;
   a heat sink comprising a top portion and a side portion, said heat sink further comprising an extending finger when viewed from a top of said package, said extending finger comprising said side portion;
   means for thermally coupling said semiconductor die with said heat sink to dissipate heat from said semiconductor die to the surroundings of said package, wherein said means for thermally coupling is interposed between said semiconductor die and said heat sink but does not directly contact said semiconductor die, and
   means for encapsulating said thermally conductive element and said heat sink such that said top portion and said side portion of said heat sink are exposed to the surroundings of said package.

11. The integrated circuit package of claim 10, wherein said extending finger extends from a corner of sad heat sink.

12. An integrated circuit package, comprising:
   a substrate comprising:
      an upper race with an electrically conductive trace formed thereon; and
      a lower face with a plurality of solder balls electrically connected thereto, wherein said trace and at least one of said plurality of solder balls are electrically connected;
   a semiconductor die mounted on said upper face of said substrate, wherein said semiconductor die is electrically connected to said trace;
   a heat sink comprising a top portion and a plurality of side portions, said heat sink further comprising a plurality of extending fingers when viewed from a top of said package, each extending finger comprising at least one of said side portions;
   a thermally conductive element thermally coupled to but not in direct contact with said semiconductor die, wherein said thermally conductive element is substantially shaped as a right rectangular solid, is interposed between said semiconductor die and said heat sink, and is attached to said heat sink; and
   an encapsulant material formed to encapsulate said upper face of said substrate, said semiconductor die, said thermally conductive element and substantially all of said heat sink except said top portion and said side portions of said heat sink.

13. The integrated circuit package of claim 12, further comprising an interface element interposed between said thermally conductive element and said semiconductor die.

14. The integrated circuit package of claim 13, wherein said interface element is in direct contact with said semiconductor die.

15. The integrated circuit package of claim 13, wherein said interface element is made of a polymer.

16. The integrated circuit package of claim 12, wherein said semiconductor die is mounted on said upper face of said substrate by direct chip attachment.

17. The integrated circuit package of claim 12, wherein a distance between said semiconductor die and said thermally conductive element is about five (5) mils or less.

18. The integrated circuit package of claim 12, wherein said thermally conductive element is made of a material from the group consisting of alumina, aluminum nitride, beryllium oxide, ceramic material, copper, diamond compound, and metal.

19. The integrated circuit package of claim 12, wherein said top portion of said heat sink comprises a plating.

20. The integrated circuit package of claim 19, wherein said plating is made of nickel.

21. The integrated circuit package of claim 12, wherein said integrated circuit package is a ball grid integrated circuit package.

22. The integrated circuit package of claim 12, the integrated circuit package of claim 3, wherein said extending finger extends from a corner of said heat sink.

23. An integrated circuit package, comprising:
   a substrate comprising:
      means for electrically interconnecting a semiconductor die; and
      means for exchanging electrical signals with an outside device;
   a semiconductor die attached and electrically connected to said substrate by attachment means;
   a heat sink comprising a top portion and a side portion, said heat sink further comprising an extending finger when viewed from a top of said package, said extending finger comprising said side portion;
   means for thermally coupling said semiconductor die to said heat sink to dissipate heat from said semiconductor die to the surroundings of said package, wherein said means for thermally coupling is interposed between said semiconductor die and said heat sink but does not directly contact said semiconductor die; and
   means for encapsulating said semiconductor die, said thermally conductive element and said heat sink such that said top portion and said side portion of said heat sink are exposed to the surroundings of said package.

24. The integrated circuit package of claim 23, wherein said extending finger extends from a corner of said heat sink.

* * * * *

UNITED STATES PATENT AND TRADEMARK OFFICE
CERTIFICATE OF CORRECTION

PATENT NO. : 6,734,552 B2
DATED : May 11, 2004
INVENTOR(S) : Edward G. Combs et al.

It is certified that error appears in the above-identified patent and that said Letters Patent is hereby corrected as shown below:

<u>Title page,</u>
Item [57], ABSTRACT,
Line 2, replace "includes" with -- including --.
Line 7, replace "an" with -- and --.

<u>Column 6,</u>
Line 50, replace "finger said" with -- finger comprising said --.
Line 58, replace "beat" with -- heat --.

<u>Column 7,</u>
Line 38, replace "race" with -- face --.

Signed and Sealed this

Fourteenth Day of December, 2004

JON W. DUDAS
*Director of the United States Patent and Trademark Office*